US012765251B2

(12) United States Patent
Fang et al.

(10) Patent No.: US 12,765,251 B2
(45) Date of Patent: Oct. 13, 2026

(54) PEROVSKITE SOLAR MODULE, PREPARATION METHOD THEREFOR, AND SOLAR PANEL

(71) Applicant: GUANGDONG BILIGHT INTELLIGENT MANUFACTURING TECHNOLOGY CO., LTD., Dongguan (CN)

(72) Inventors: Wei-Chia Fang, Dongguan (CN); Chung-Chin Hsiao, Dongguan (CN); Tzu-Chien Wei, Dongguan (CN)

(73) Assignee: GUANGDONG BILIGHT INTELLIGENT MANUFACTURING TECHNOLOGY CO., LTD., Dongguan (CN)

( * ) Notice: Subject to any disclaimer, the term of this patent is extended or adjusted under 35 U.S.C. 154(b) by 0 days.

(21) Appl. No.: 19/367,930

(22) Filed: Oct. 24, 2025

(65) Prior Publication Data

US 2026/0182238 A1 Jun. 25, 2026

(30) Foreign Application Priority Data

Dec. 24, 2024 (CN) ........................ 202411919536.3

(51) Int. Cl.
*H10K 71/00* (2023.01)
*H10K 39/10* (2026.01)
*H10K 71/50* (2023.01)

(52) U.S. Cl.
CPC ........... *H10K 71/851* (2023.02); *H10K 39/10* (2023.02); *H10K 71/50* (2023.02)

(58) Field of Classification Search
CPC ....... H10K 71/50; H10K 71/851; H10K 39/10
See application file for complete search history.

(56) References Cited

U.S. PATENT DOCUMENTS

2021/0090817 A1* 3/2021 Lifka ..................... H10K 85/50
2023/0083628 A1* 3/2023 Yamamoto ........... H01G 9/2009

FOREIGN PATENT DOCUMENTS

CN 111261784 A * 6/2020 ............ H10K 30/80
CN 211529980 U * 9/2020

OTHER PUBLICATIONS

Machine translation of CN-111261784-A, Yang, Song-Wang. (Year: 2020).*
Machine translation of CN-211529980-U, Chen, Xin-yu. (Year: 2020).*

* cited by examiner

*Primary Examiner* — Mayla Gonzalez Ramos
(74) *Attorney, Agent, or Firm* — Carter, DeLuca & Farrell LLP

(57) ABSTRACT

A perovskite solar module, a preparation method therefor, and a solar panel. The preparation method includes steps of: providing a substrate; forming a plurality of perovskite solar devices on the substrate; applying a first encapsulation layer on a surface of each perovskite solar device facing away from the substrate, and applying a second encapsulation layer on sidewalls of each perovskite solar device; laminating a cover plate onto the surface of each perovskite solar device via the first encapsulation layer, where an orthographic projection of each perovskite solar device on the substrate falls within an orthographic projection of the cover plate on the substrate. By cutting the substrate and cover plate, multiple small-sized perovskite solar modules can be simultaneously obtained from a single substrate.

8 Claims, 4 Drawing Sheets

PEROVSKITE SOLAR MODULE, PREPARATION METHOD THEREFOR, AND SOLAR PANEL

CROSS-REFERENCE TO RELATED APPLICATION

Pursuant to 35 U.S.C. § 119 and the Paris Convention, this application claims the benefit of Chinese Patent Application No. 202411919536.3 filed on Dec. 24, 2024, the content of which is incorporated herein by reference.

FIELD OF TECHNOLOGY

The following relates to the field of solar cell technology, more particularly to a perovskite solar module, a preparation method therefor, and a solar panel.

BACKGROUND

The statements provided herein are merely background information related to the present application, and do not necessarily constitute any prior arts. Currently, conventional solar photovoltaic module packaging typically involves encapsulating silicon crystalline solar devices with two layers of glass and packaging material. Most outdoor solar photovoltaic systems employ this module packaging design.

SUMMARY

It is an objective of the present application to provide a perovskite solar module, a preparation method therefor, and a solar panel, aiming to address the problems associated with conventional solar photovoltaic modules.

In accordance with a first aspect of embodiments of the present application, a preparation method for a perovskite solar module is provided, which includes steps of: providing a substrate; forming a plurality of perovskite solar devices on the substrate; applying, for each of the plurality of perovskite solar devices, a first encapsulation layer on a surface of the perovskite solar device facing away from the substrate, and applying a second encapsulation layer on sidewalls of the perovskite solar device; laminating a cover plate onto the surface of each of the perovskite solar devices via the first encapsulation layer, where an orthographic projection of each perovskite solar device on the substrate falls within an orthographic projection of the cover plate on the substrate; and cutting the substrate and cover plate to obtain a plurality of perovskite solar modules. Each perovskite solar module includes a sub-substrate, a perovskite solar device and a sub-cover plate that are sequentially stacked in layer. The sub-substrate is obtained by cutting the substrate, and the sub-cover plate is obtained by cutting the cover plate.

In one embodiment, the method also includes a step of: forming, for each of the plurality of perovskite solar devices, a third encapsulation layer at the sidewalls of the perovskite solar module. The third encapsulation layer covers two surfaces of the sub-substrate and the sub-cover plate that are opposite to each other as well as a surface of the second encapsulation layer.

In one embodiment, the third encapsulation layer also covers at least a portion of sidewalls of the sub-cover plate.

In one embodiment, the third encapsulation layer also covers sidewalls of the sub-cover plate and an edge of a surface of the sub-cover plate facing away from the sub-substrate.

In one embodiment, the perovskite solar device includes a first transmission layer, a light absorption layer, a second transmission layer and a first electrode layer sequentially stacked in layer on the substrate in a direction away from the substrate. Alternatively, the perovskite solar device includes a second electrode layer, the first transmission layer, the light absorption layer, the second transmission layer and the first electrode layer sequentially stacked in layer on the substrate in a direction away from the substrate.

In one embodiment, an orthographic projection of the sub-cover plate on the sub-substrate lies within the sub-substrate.

In one embodiment, the first, second, and third encapsulation layers are made of at least one of acrylic resin, epoxy resin, and polyurethane. The sub-cover plate and the sub-substrate are made of at least one of glass and plastic.

In one embodiment, the first encapsulation layer covers the surface of the perovskite solar device facing away from the sub substrate and the sidewalls of the perovskite solar device.

In accordance with a second aspect of embodiments of the present application, a perovskite solar module is provided, which includes a sub-substrate, a perovskite solar device, a first encapsulation layer, and a sub-cover plate, sequentially stacked in layer. The second encapsulation layer also includes a second encapsulation layer interposed between the sub-substrate and the sub-cover plate, the second encapsulation layer covering at least sidewalls of the perovskite solar device.

In accordance with a third aspect of embodiments of the present application, a solar panel is provided, which includes the perovskite solar module prepared by the above-described preparation method.

Compared to the existing technologies, the embodiments of the present application have the advantage that, by cutting the substrate and cover plate, multiple small-sized perovskite solar modules can be simultaneously obtained from a single substrate. The first encapsulation layers can be used to adhere the cover plate, while the second encapsulation layers provide additional protection for the perovskite solar devices during the cutting of the substrate and cover plate.

DETAILED DESCRIPTION OF THE EMBODIMENTS

To illustrate the technical problems to be solved, technical solutions, and beneficial effects of the present application more clearly, the following is a further detailed description of the present application in combination with the accompanying drawings and embodiments. It should be understood that the specific embodiments described herein are intended only to illustrate the present application and are not intended to limit the present application.

It should be noted that when an element is referred to as being "fixed to" or "disposed/arranged on" another element, it may be directly or indirectly on the other element. When an element is referred to as being "connected to" another element, it may be directly or indirectly connected to the other element.

It should be understood that terms such as "length," "width," "upper," "lower," "front," "back," "left," "right," "vertical," "horizontal," "top," "bottom," "inner," and "outer" to indicate positions or relationships are based on the positions or relationships shown in the accompanying drawings and are intended solely for the purpose of facilitating and simplifying the description of the present application, rather than indicating or implying that the devices or elements referred to must have a specific orientation, be constructed, or operate in a specific orientation, and therefore should not be construed as limiting this application.

In addition, the terms "first" and "second" are used for descriptive purposes only and should not be understood as indicating or suggesting relative importance or implicitly indicating the quantity of the technical features indicated. Thus, a feature defined as "first" or "second" may explicitly or implicitly include one or more of such features. In the description of this application, the phrase "a/the plurality of" means two or more, unless otherwise explicitly and specifically limited.

Figure 1:
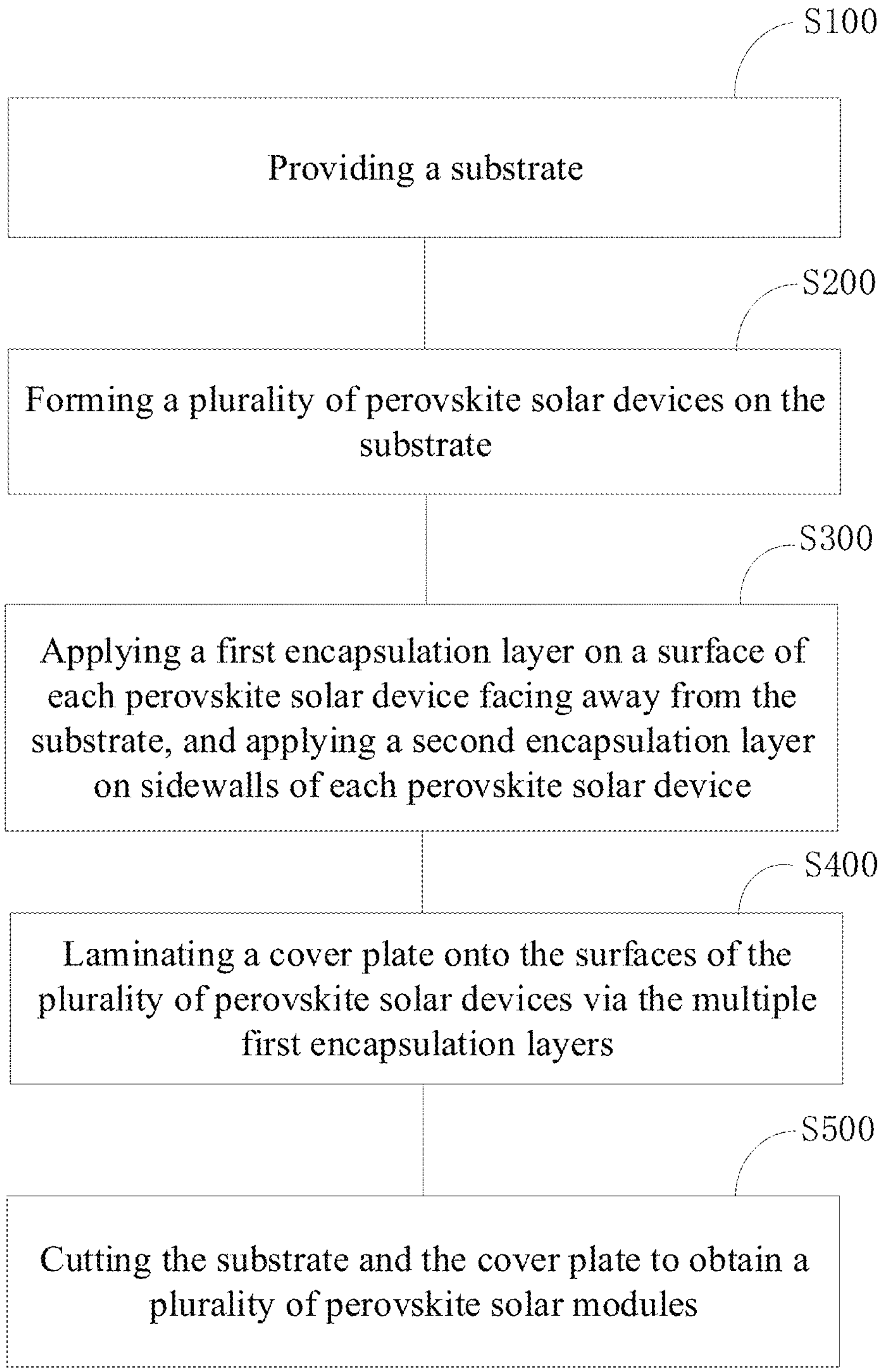
FIG. 1 is a flow chart of a preparation method for a perovskite solar module according to an embodiment of the present application.

FIG. 1 shows a flow chart of a preparation method for a perovskite solar module according to a first embodiment of the present application. For ease of illustration, only the portions relevant to this embodiment are shown, which are described in detail as follows:

A preparation method for a perovskite solar module includes steps S100 to S500.

In step S100: a substrate is provided.

In step S200: a plurality of perovskite solar devices are formed on the substrate.

Figure 2:
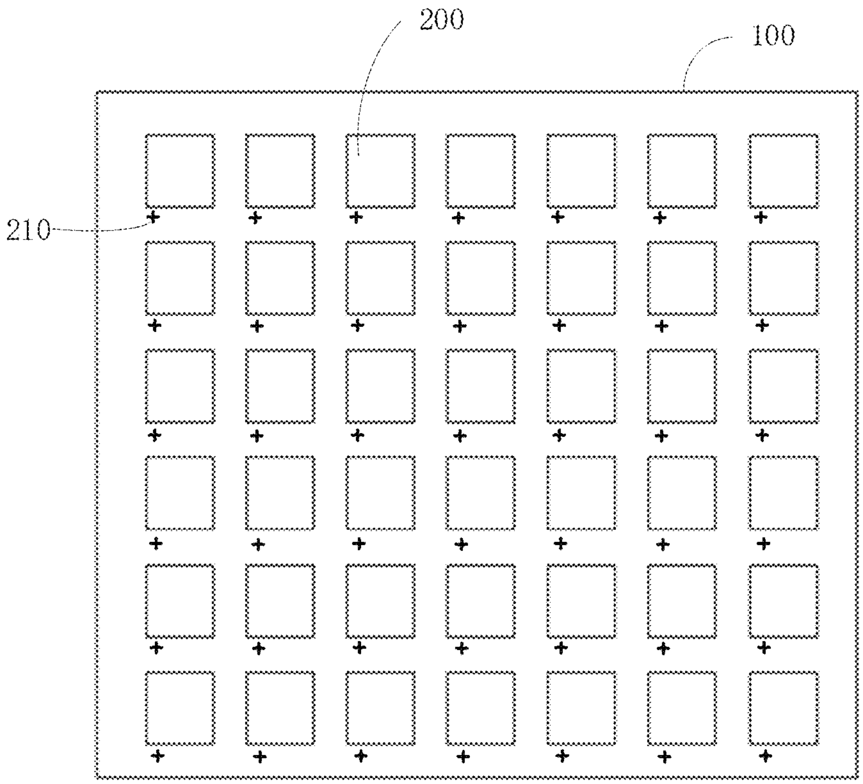
FIG. 2 is a schematic diagram of an arrangement of perovskite solar devices according to an embodiment of the present application.
Figure 3:
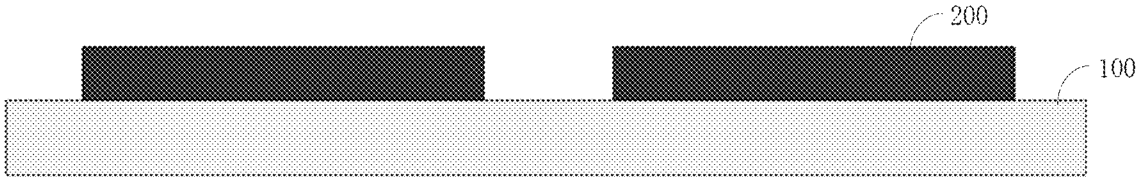
FIG. 3 is a schematic diagram of a cross-sectional view of a device after performing step S200 according to an embodiment of the present application.

As shown in FIGS. 2 and 3, in some embodiments, the plurality of perovskite solar devices 200 are arranged in an array on the substrate 100.

In step S300: first encapsulation layers are applied to surfaces of the perovskite solar devices facing away from the substrate, and second encapsulation layers are applied to sidewalls of the perovskite solar devices.

In step S400: a cover plate is laminated onto the surfaces of the perovskite solar devices via the multiple first encapsulation layers. An orthographic projection of each perovskite solar device 200 on the substrate 100 falls within an orthographic projection of the cover plate 300 on the substrate 100. That is, each perovskite solar cell device 200 is positioned between the substrate 100 and the cover plate 300. The first encapsulation layer 400 has a thickness being less than 1000 μm.

Figure 4:
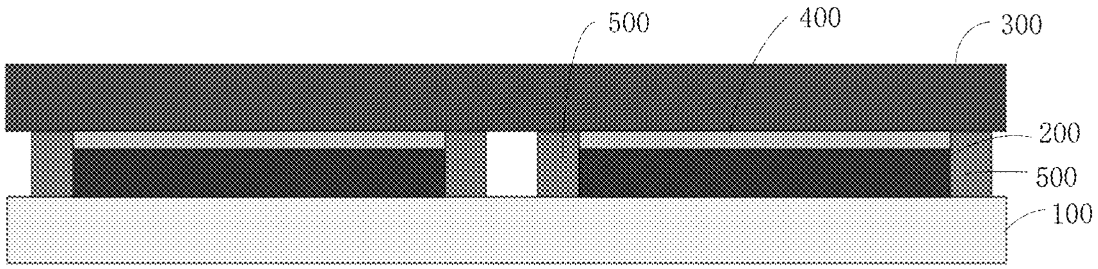
FIG. 4 is a schematic diagram of a cross-sectional view of a device after performing step S400 according to an embodiment of the present application.

As shown in FIG. 4, the first encapsulation layers 400 correspond one-to-one with the perovskite solar cell devices 200. The first encapsulation layer 400 is used to adhere the cover plate 300 to the corresponding perovskite solar cell device 200.

The first encapsulation layers 400 may be formed by first applying an encapsulation material on the surface of each perovskite solar cell device 200 and then curing the encapsulation material using a light-curing or thermal-curing technique.

As shown in FIG. 4, the second encapsulation layers 500 correspond one-to-one with the perovskite solar devices 200. The second encapsulation layer 500 is used to wrap the corresponding perovskite solar cell device 200. The second encapsulation layers 500 serves to protect the sidewalls of each perovskite solar cell device 200.

In step S500: the substrate and the cover plate are cut to obtain a plurality of perovskite solar cell modules. Each of the perovskite solar modules includes a sub-substrate 110, a perovskite solar device 200 and a sub-cover plate 310 that are sequentially stacked in layer. The sub-substrate 110 is obtained by cutting the substrate 100, while the sub-cover plate 310 is obtained by cutting the cover plate.

Figure 5:
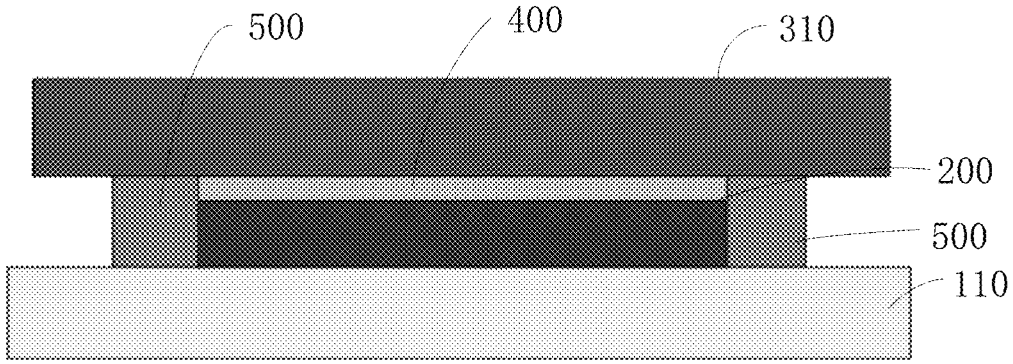
FIG. 5 is a schematic diagram of a cross-sectional view of a device after performing step S500 according to an embodiment of the present application.

As shown in FIG. 5, by cutting the substrate 100 and cover plate 300, multiple small-sized perovskite solar modules can be simultaneously obtained from the single substrate 100. The first encapsulation layer 400 can be used to adhere the cover plate 300, while the second encapsulation layer 500 provides additional protection for the perovskite solar device 200 during the cutting of the substrate 100 and the cover plate.

In some embodiments, as shown in FIG. 2, in step S200, first positioning targets 210 that correspond one-to-one with the perovskite solar devices 200 may be formed on the substrate 100. The first positioning targets 210 are configured to accurately position each perovskite solar device 200 to facilitate accurate cutting of the substrate 100 in step S500.

An orthographic projection of each first positioning target 210 on the substrate 100 may be a cross.

The first positioning targets 210 may be formed simultaneously with the construction of the perovskite solar devices 200, utilizing the material used to form the perovskite solar device 200.

In some embodiments, in step S200, second positioning targets that correspond one-to-one with the perovskite solar devices 200 may be formed on the substrate 100. The second positioning targets are configured to accurately position each perovskite solar device 200 to facilitate accurate cutting of the cover plate 300 in step S500.

In one embodiment, the preparation method further includes step S600.

In step S600: a third encapsulation layer 600 is formed at the sidewalls of each perovskite solar module. The third encapsulation layer 600 covers the two opposing surfaces of the sub-substrate 110 and the sub-cover plate 310 as well as a surface of the second encapsulation layer 500.

Figure 6:
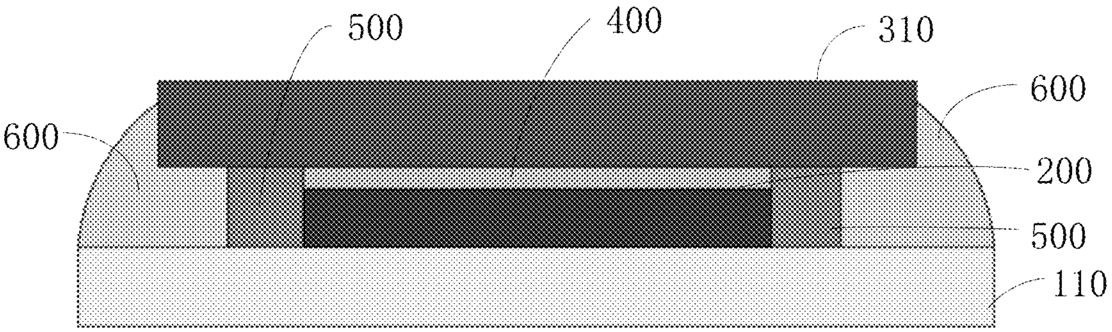
FIG. 6 is a schematic diagram of a cross-sectional view of a device after performing step S600 according to an embodiment of the present application.

As shown in FIG. 6, to prevent damage to the perovskite solar device 200 when cutting the substrate 100 and cover plate 300, the cutting positions of the substrate 100 and the cover plate 300 in step S500 must maintain a certain gap from the second encapsulation layer 500. After cutting, the area of the sub-substrate 110 and sub-cover plate 310 will be larger than the total area of the first encapsulation layer 400, the perovskite solar device 200 and the second encapsulation layer 500. It will be appreciated that the provision of the third encapsulation layer 600 further stabilizes the sub-substrate 110 and sub-cover plate 310, preventing the sub-substrate 110 and/or sub-cover plate 310 from separating due to external forces in the resulting perovskite solar module.

In one embodiment, the third encapsulation layer 600 also covers at least a portion of the sidewalls of the sub-cover plate 310.

By covering a portion of the sidewalls of the sub-cover plate 310 with the third encapsulation layer 600, the sub-cover plate 310 can be further secured.

At the same time, the perovskite solar device 200 can be further isolated from the external environment.

In one embodiment, the third encapsulation layer 600 also covers the sidewalls of the sub-cover plate 310 and an edge of a surface of the sub-cover plate 310 facing away from the sub-substrate 110.

Figure 7:
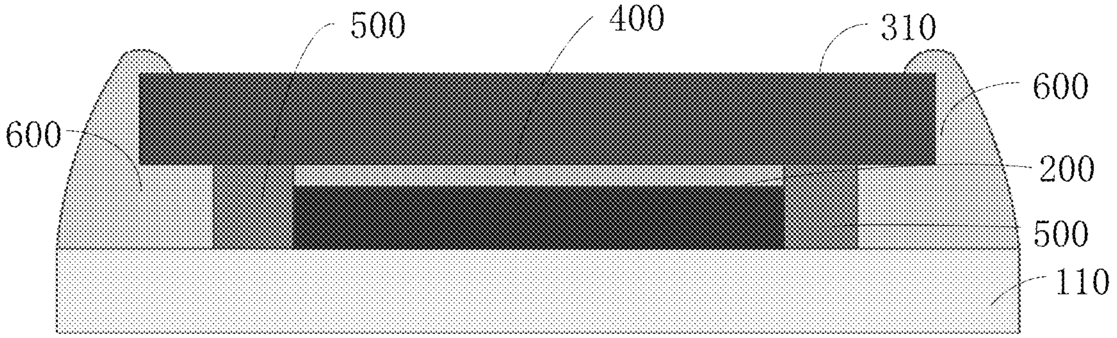
FIG. 7 is a schematic diagram of another cross-sectional view of a device after performing step S600 according to an embodiment of the present application.

As shown in FIG. 7, by covering the sidewalls of the sub-cover plate 310 and a portion of the surface of the sub-cover plate 310 facing away from the sub-substrate 110, the third encapsulation layer 600 can wrap around the sub-cover plate 310, further strengthening its securement.

In the meantime, the perovskite solar device 200 can be further isolated from the external environment.

In one embodiment, the perovskite solar device 200 includes a first transmission layer, a light absorption layer, a second transmission layer and a first electrode layer, stacked sequentially on the substrate 100 in a direction away from the substrate 100. Alternatively, the perovskite solar device 200 includes a second electrode layer, the first transmission layer, the light absorption layer, the second transmission layer and the first electrode layer, stacked sequentially on the substrate 100 in a direction away from the substrate 100.

The light absorption layer is made of a perovskite material.

The light absorption layer and the transmission layer can achieve energy conversion, converting solar energy into electrical energy. The resulting electrical energy can ultimately be output to other electrical devices or modules through the electrode layer.

Specifically, one of the first and second transmission layers is typically configured to transport electrons and the other to transport holes, enabling energy conversion through the coordinated operation of the transmission layers.

For example, in some embodiments, the first transmission layer is configured to transport electrons, while the second transmission layer is configured to transport holes.

The second electrode layer and the first electrode layer are configured to connect to other circuits to output the electrical energy generated by the perovskite solar device 200.

The various transmission layers and electrode layers may be configured according to actual needs and will not be further described in this embodiment.

In one embodiment, the orthographic projection of the sub-cover plate 310 on the sub-substrate 110 falls within the sub-substrate 110. That is, the area of the sub-cover plate 310 is smaller than the area of the sub-substrate 110.

In one embodiment, the material of the first encapsulation layer 400, the second encapsulation layer 500 or the third encapsulation layer 600 includes at least one of acrylic resin, epoxy resin, and polyurethane.

The materials of the first encapsulation layer 400, the second encapsulation layer 500, and the third encapsulation layer 600 may be the same or different.

In one embodiment, the sub-cover plate 310 and the sub-substrate 110 are made of at least one of glass and plastic. Similarly, the substrate 100 and the cover plate 300 are made of at least one of glass and plastic.

Preferably, both the sub-cover plate 310 and the sub-substrate 110 are made of glass.

In one embodiment, the surface and sidewalls of the perovskite solar device 200 are all covered by the first encapsulation layer 400.

Figure 8:
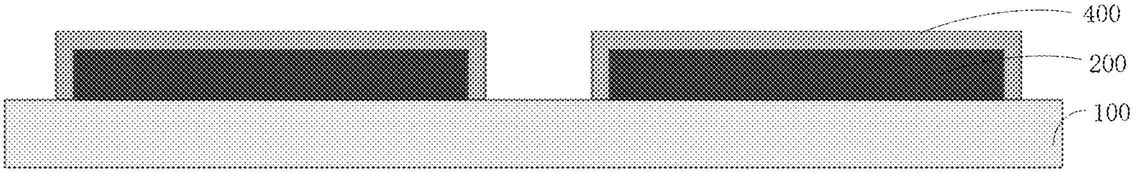
FIG. 8 is a schematic diagram of another cross-sectional view of a device after performing step S400 according to an embodiment of the present application.

As shown in FIG. 8, in step S300, the surfaces of all the perovskite solar devices 200 are completely covered by the plurality of first encapsulation layers 400 to isolate the perovskite solar devices 200 from the external environment. A second encapsulation layer 500 may be further applied to a surface of the first encapsulation layer 400 on the sidewalls of the perovskite solar device 200 to increase the total contact area between the encapsulation layer and the cover plate 300, thereby enhancing protection for the perovskite solar device 200 and ensuring a stronger bond between the cover plate 300 and the perovskite solar device 200.

As shown in FIG. 5, an embodiment of the present application provides a perovskite solar module, which includes a sub-substrate 110, a perovskite solar device 200, a first encapsulation layer 400, and a sub-cover plate 310 that are sequentially stacked in layer. The perovskite solar module also includes a second encapsulation layer 500 interposed between the sub-substrate 110 and the sub-cover plate 310. The second encapsulation layer 500 covers at least the sidewalls of the perovskite solar device 200.

By cutting the substrate 100 and the cover plate 300, multiple small-sized perovskite solar modules can be obtained simultaneously from a single substrate 100. The first encapsulation layer 400 can be used for adhering the cover plate 300, while the second encapsulation layer 500 can provide further protection for the perovskite solar device 200 during the cutting of the substrate 100 and the cover plate 300.

An embodiment of the present application provides a solar panel, which includes a perovskite solar module prepared according to the above-described preparation method.

As shown in FIG. 5, the perovskite solar panel includes a sub-substrate 110, a perovskite solar device 200, a first encapsulation layer 400 and a sub-cover plate 310 that are sequentially stacked in layer. The perovskite solar module also includes a second encapsulation layer 500 which is interposed between the sub-substrate 110 and the sub-cover plate 310 and covers at least the sidewalls of the perovskite solar device 200.

In some embodiments, the solar panel includes a plurality of perovskite solar modules. The plurality of perovskite solar modules are arranged and interconnected in a specific sequence and matrix.

It should be understood that the sequence numbers of the steps in the above embodiments do not imply a specific order of execution. The execution order of each process is determined by its function and inherent logic and does not constitute any limitation on the implementation of the embodiments of the present application.

Persons skilled in the art will clearly understand that, for the sake of convenience and brevity, the division of the above functional units and modules is used only as an example. In actual applications, the above functions may be assigned to different functional units or modules as needed. That is, the internal structure of the device may be divided into different functional units or modules to perform all or part of the functions described above. The functional units and modules in the embodiments may be integrated into a single processing unit, each unit may exist physically alone, or two or more units may be integrated into a single unit. These integrated units may be implemented as either hardware or software functional units. Furthermore, the specific names of the functional units and modules are for ease of distinction only and are not intended to limit the protection scope of the present application. Specific operating processes of the units and modules in the above-mentioned systems may be referenced to the corresponding processes in the aforementioned method embodiments and will not be elaborated upon here.

In the above-mentioned embodiments, the descriptions of each embodiment have their own specific focus. For portions not described or detailed in a particular embodiment, reference should be made to the relevant descriptions of other embodiments.

The above-mentioned embodiments are intended only to illustrate the technical solutions of the present application and are not intended to limit them. Although the present application has been described in detail with reference to the aforementioned embodiments, persons of ordinary skill in the art should understand that modifications may be made to the technical solutions described in the aforementioned embodiments, or that some of the technical features therein may be replaced with equivalents. Such modifications or replacements do not deviate from the spirit and scope of the technical solutions of the various embodiments of the present application and thus should all be included within the protection scope of the present application.

What is claimed is:

1. A preparation method for a perovskite solar module, comprising:

providing a substrate;

forming a plurality of perovskite solar devices on the substrate;

applying, for each of the plurality of perovskite solar devices, a first encapsulation layer on a surface of the perovskite solar device facing away from the substrate, and a second encapsulation layer on sidewalls of the perovskite solar device;

laminating a cover plate onto the surface of each of the plurality of perovskite solar devices via the first encapsulation layer, wherein an orthographic projection of each of the plurality of perovskite solar devices on the substrate falls within an orthographic projection of the cover plate on the substrate; and cutting the substrate and the cover plate to obtain a plurality of perovskite solar modules, each of the plurality of perovskite solar modules comprising a sub-substrate, a perovskite solar device and a sub-cover plate that are sequentially stacked in order, wherein the sub-substrate is obtained by cutting the substrate, and the sub-cover plate is obtained by cutting the cover plate.

2. The preparation method according to claim 1, further comprising:

forming, for each of the plurality of perovskite solar modules, a third encapsulation layer at sidewalls of the perovskite solar module, wherein the third encapsulation layer covers two surfaces of the sub-substrate and the sub-cover plate that are opposite to each other and a surface of the second encapsulation layer.

3. The preparation method according to claim 2, wherein the third encapsulation layer further covers at least a portion of sidewalls of the sub-cover plate.

4. The preparation method according to claim 2, wherein the third encapsulation layer further covers sidewalls of the sub-cover plate and an edge of a surface of the sub-cover plate facing away from the sub-substrate.

5. The preparation method according to claim 1, wherein the perovskite solar device comprises a first transmission layer, a light absorption layer, a second transmission layer, and a first electrode layer sequentially stacked in order on the substrate in a direction away from the substrate; or the perovskite solar device comprises a second electrode layer, the first transmission layer, the light absorption layer, the second transmission layer, and the first electrode layer sequentially stacked in order on the substrate in the direction away from the substrate.

6. The preparation method according to claim 1, wherein an orthographic projection of the sub-cover plate on the sub-substrate lies within the sub-substrate.

7. The preparation method according to claim 2, wherein the first encapsulation layer, the second encapsulation layer and the third encapsulation layer are made of at least one of acrylic resin, epoxy resin, and polyurethane; and the sub-cover plate and the sub-substrate are made of at least one of glass and plastic.

8. The preparation method according to claim 1, wherein the first encapsulation layer covers the surface of the perovskite solar device facing away from the sub-substrate and the sidewalls of the perovskite solar device.

* * * * *